United States Patent [19]

Lymer

[11] Patent Number: 4,916,411

[45] Date of Patent: Apr. 10, 1990

[54] VARIABLE FREQUENCY JITTER GENERATOR

[75] Inventor: Anthony Lymer, West Lothian, Scotland

[73] Assignee: Hewlett-Packard Company, Palo Alto, Calif.

[21] Appl. No.: 354,544

[22] Filed: May 19, 1989

[30] Foreign Application Priority Data

Jun. 8, 1988 [EP] European Pat. Off. ........ 88305206.0

[51] Int. Cl.⁴ .................... H03B 21/00; H03B 29/00; H03K 3/84
[52] U.S. Cl. ........................................ 331/25; 328/28; 328/55; 328/59; 328/155; 331/39; 331/40; 331/78; 375/10
[58] Field of Search .................. 331/37, 38, 39, 40, 331/46, 48, 78, 25; 375/10; 328/55, 59, 155, 164, 28

[56] References Cited

U.S. PATENT DOCUMENTS 3,916,329 10/1975 Hekimian et al. .................... 328/155
4,258,436 3/1981 Campbell .............................. 375/10

OTHER PUBLICATIONS

*Jitter in Digital Transmission Systems—Characteristics and Measurement Techniques*, J. J. Baldini et al; vol. 2, Nov. 29–Dec. 2, 1982, pp. 658–664, IEEE Global Communications Conference, Miami.
*What You Don't Know About T1 Jitter Can Give You the Jitters*, K. B. Flynn; Data Communications, New York; vol. 16, No. 5; May 1987; pp. 151–166.

Primary Examiner—Siegfried H. Grimm
Attorney, Agent, or Firm—Richard F. Schuette

[57] ABSTRACT

A circuit for generating jitter includes a mixer which mixes a jittered signal from a jitter generator with the output of a variable frequency oscillator to produce a broadband jittered output. A preferred form of the circuit uses a double frequency translation technique in which the output from a reference oscillator is applied to a jitter generator and to a first frequency translation device to translate a variable input frequency to an intermediate frequency. The jittered signal and the intermediate frequency signal are then applied to a second frequency translation device to produce a jittered output at the variable input frequency.

10 Claims, 3 Drawing Sheets

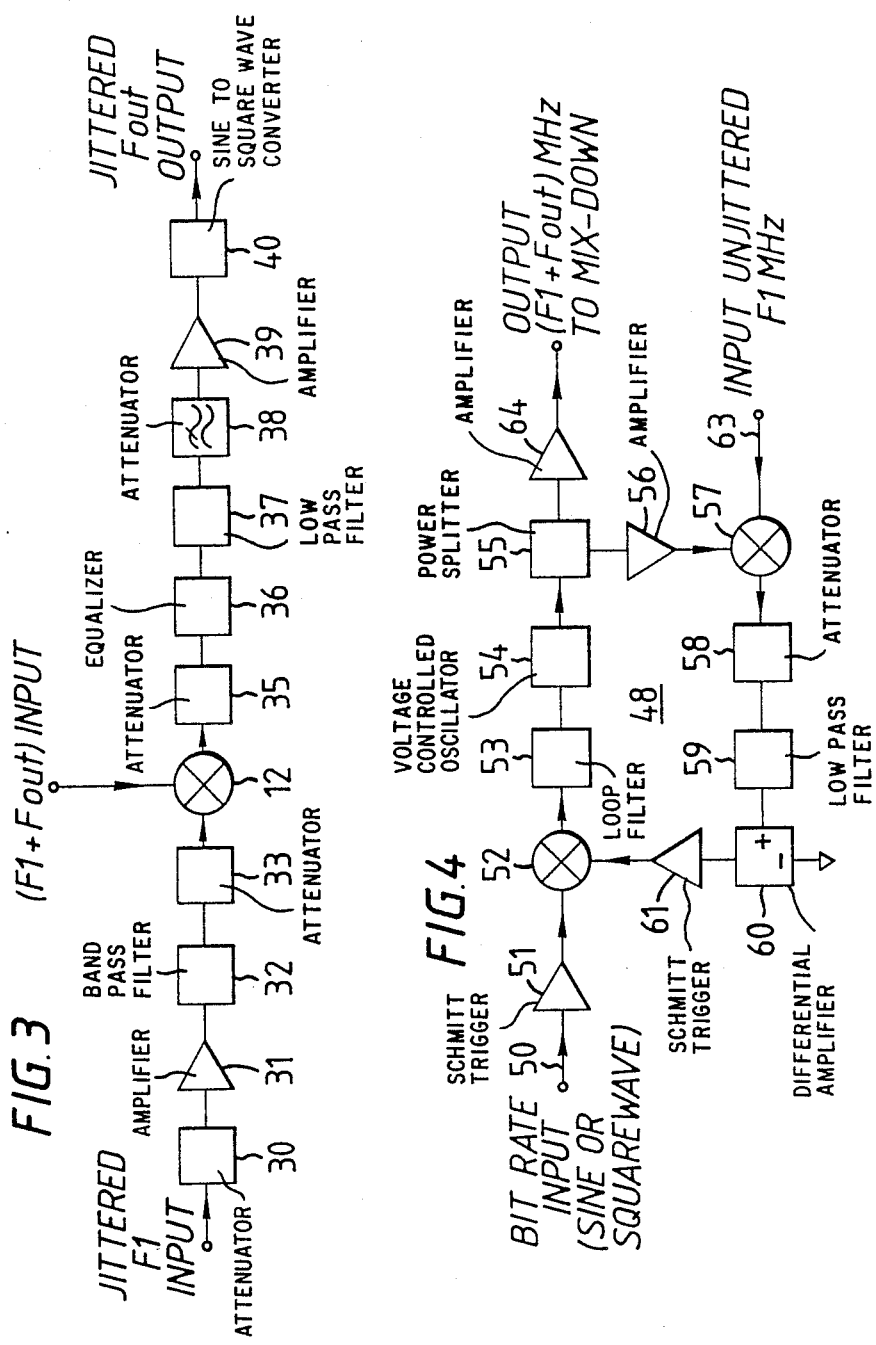

VARIABLE FREQUENCY JITTER GENERATOR

This invention relates to jitter generators. Jitter generators are used in the testing of digital telecommunication systems in which pulse code modulation is used for the transmission of speech or other digital data. Such data transmission systems are required to operate even if the transmitted signals have what is known as timing jitter, that is to say the signals occur at time instants shifted from their normal or expected times of occurrence. In order to test and evaluate the way in which digital transmission systems perform in the presence of jitter, jitter generators are employed to apply to such systems digital signals which contain specified amounts of timing jitter.

Known jitter generators produce outputs which have only a narrow range of bit rates which occur at plus or minus 10% around a nominal operating frequency. In order to provide jitter generation at several bit rates, differing by more than 10%, it has been the practice to produce generator circuits which replicate certain circuit elements, so that a particular element only comes into use when a frequency associated with that element is selected. For example, in one known jitter generator, there is provided a separate voltage controlled oscillator, carrier filters, loop filters, and a crystal oscillator for each output bit rate which can be provided by the jitter generator. It is wasteful of circuit elements to produce such replication and an object of the present invention is to provide a jitter generator which can produce a range of bit rates without unnecessary replication of circuit elements.

According to the present invention there is provided a circuit for generating jitter which comprises a jitter generator arranged to apply jitter to a signal at a first frequency, a variable frequency oscillator, and means for mixing the output from the jitter generator and the output of the oscillator. The output of the mixer may be fed to a filter. The output of the filter can be applied to a sine to squarewave converter.

The output of the variable frequency oscillator may be combined with the output of an oscillator which drives the jitter generator to produce an intermediate frequency signal which is then combined with the output of the jitter generator. The output of the variable frequency oscillator and the output of the other oscillator may be combined in a mixer the output of which is fed to a bandpass filter to produce the intermediate frequency signal. Preferably the output of the variable frequency oscillator and the output of the oscillator which drives the jitter generator are combined using a phase locked loop arrangement.

The invention will be described now by way of example only, with particular reference to the accompanying drawings. In the drawings:

FIG. 3 is a block schematic diagram illustrating in more detail, parts of the circuit of FIG. 2;

FIG. 4 is a block diagram illustrating other circuit elements of FIG. 2; and

Figure 1:
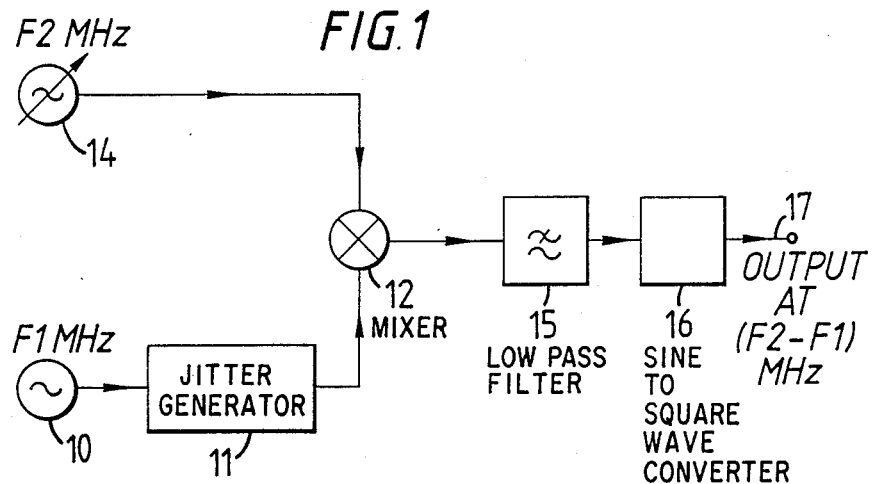
FIG. 1 is a block schematic diagram illustrating a jitter generator in accordance with the present invention.

Referring to FIG. 1, a circuit for generating jitter comprises a crystal oscillator 10, which is arranged to operate at an arbitrary fixed frequency F1 MHz. The output of this oscillator is applied to a conventional jitter generator 11 which is designed to operate at the frequency F1. The output from the jitter generator 11 is applied to a mixer 12, which also receives the output from variable oscillator 14 which can operate at a variable frequency F2 MHz. The mixer combines the two signals to produce an output signal which has jitter impressed on it. This signal is applied to a filter 15 and then to a sine to squarewave converter 16. The frequency of the signal at the output of the mixer 12 is (F1+F2) or (F1−F2) and one of these is selected by the filter 15 so that there is a single frequency appearing at the output of the filter. The sine to squarewave converter produces the desired binary waveform at an output 17, this waveform having jitter applied to it. The frequency of the jittered signals can be varied by varying F2.

The circuit described above can produce, at the output 17, a jittered clock waveform over many octaves. Typically the circuit can have a low pass filter capable of selecting (F2−F1) MHz operating from 0 to 35 MHz, from a jitter generator operating at 139.264 MHz.

It will thus be seen that a relatively simple circuit can be used to produce a wide range of jittered outputs without unnecessary replication of circuit elements. The jitter generator can work at a single frequency which is selectable and variable and eliminates replication of carrier filters, loop filters, and voltage controlled oscillators. Only the frequency of the oscillator 14 needs to be altered in order to achieve a different bit rate at the output. The higher operating frequency of the generator, i.e. at F1 which is greater than F2−F1, means that the jitter can be generated to higher modulating frequencies than has been possible with conventional generators. This is because the maximum modulation frequency is limited to a fraction, approximately one tenth, of the frequency at which jitter is generated. Furthermore, the modulation frequency range is independent of the output bit rate.

There may be situations where this basic relatively simple circuit does have some limitations. The oscillator which operates at (F1+F2) MHz is specific to the equipment and may not conveniently be available from a system under test. Furthermore, the phase noise of the two oscillators is summed at the output and, since both F1 and F2 are larger than F2−F1 and the phase noise of comparable oscillators is very roughly proportional to the frequency of oscillation, then the output phase noise may be worse than a single frequency jitter generator operating at the output frequency of F2−F1 MHz. If the sum of F1 and F2 were selected so that the output from the circuit of FIG. 1 was F1+F2 MHz then the output phase noise will be comparable to that of a jitter generator operating directly at the rate F1+F2, but the range of modulation frequencies which is limited to some fraction of the frequency F1, would be less than that available when generating at the rate F1+F2 MHz. Also, it is difficult to synchronise the output frequency with a given input frequency which may be required when in what is known as a through jitter mode.

Figure 2:
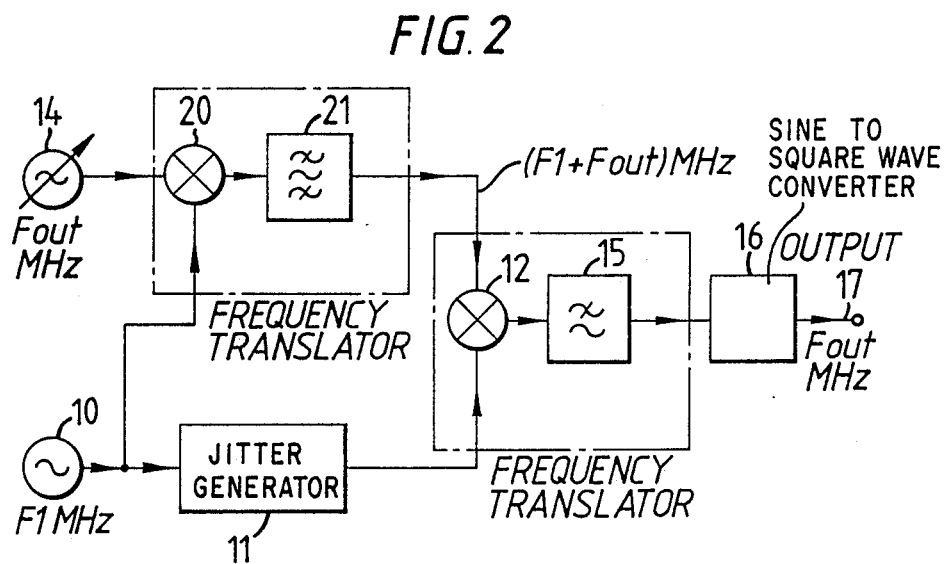
FIG. 2 is a block schematic diagram of another embodiment of a jitter generator in accordance with the present invention.

An enhanced circuit which does not suffer from these limitations is shown in FIG. 2 of the drawings. This circuit, which is capable of producing a jittered output over a frequency range from 0.5 to 200 MHz, includes elements corresponding to the elements of FIG. 1, and these are shown by corresponding reference numerals. In the circuit of FIG. 2, it will be seen that the output of the variable frequency oscillator 14 is fed to a further mixer 20, which also receives the output from the fixed frequency oscillator 10. The output of the mixer 20 is fed via a bandpass filter 21 to the mixer 12. The mixer 20 and the bandpass filter 21 essentially comprise a first frequency translation device whilst the mixer 12 and lowpass filter 15 make up a second frequency translation device.

In the circuit of FIG. 2, the oscillator 14 which is a variable frequency oscillator operates at a frequency corresponding to the desired output bit rate Fout, whilst the reference oscillator 10 operates at an arbitrary frequency F1. The outputs from these oscillators are applied as inputs to the mixer 20 which thus has outputs of F1+/−Fout. The filter 21 selects one of these outputs, e.g. F1+Fout, and rejects all other mixer outputs.

The output from the oscillator 10 is also fed to the jitter generator 11, which is of conventional design, and this output, with jitter impressed upon it, is mixed, in the mixer 12, with the signal F1+Fout from the first frequency translation device. The output from the mixer is a signal at Fout and other frequencies. The filter 15 operates to eliminate all the other frequencies, leaving only a jittered component at Fout. The signal is then converted from a sine wave to a binary signal in the sinewave to squarewave converter 16 so that the required jittered digital signal appears at output 17.

It will be appreciated that FIG. 2 is a schematic illustration of a preferred form of the present invention. As explained above, the mixer 20 and the bandpass filter 21 comprise a frequency translation device, but this could be replaced by some other arrangement. For example, in practical arrangements it is relatively difficult to generate low bit rates as the output of the mixer 20 also has components at F1. It is also difficult to design a filter which has a sufficiently sharp cut off to reject F1 which will also pass F1+Fout when the frequencies are close together and still retain the necessary broadband operation. For this reason a practical circuit may differ slightly from that shown schematically in FIG. 2, although FIG. 2 is provided to illustrate the basic principles of operation. Similarly the mixer 12 and filter 15 could also be replaced by a different arrangement to produce the same result.

The arrangement described above reduces, or eliminates, the limitations of the mixing generator described with reference to FIG. 1. It will be seen that the output is now at the bit rate Fout rather than F1+Fout. Thus, within the bandwidth of the filter 21, the phase noise of the oscillator 10, which is present on both the output from the filter 21 and on the output from the generator 11, tends to cancel at the mixer 12. This greatly improves the phase noise at the output 17 which approaches that of the oscillator 14 for small offset frequencies. It should be noted that the oscillator 14 at the bit rate may be replaced by another signal which allows synchronisation to an externally provided clock waveform.

Figure 5:
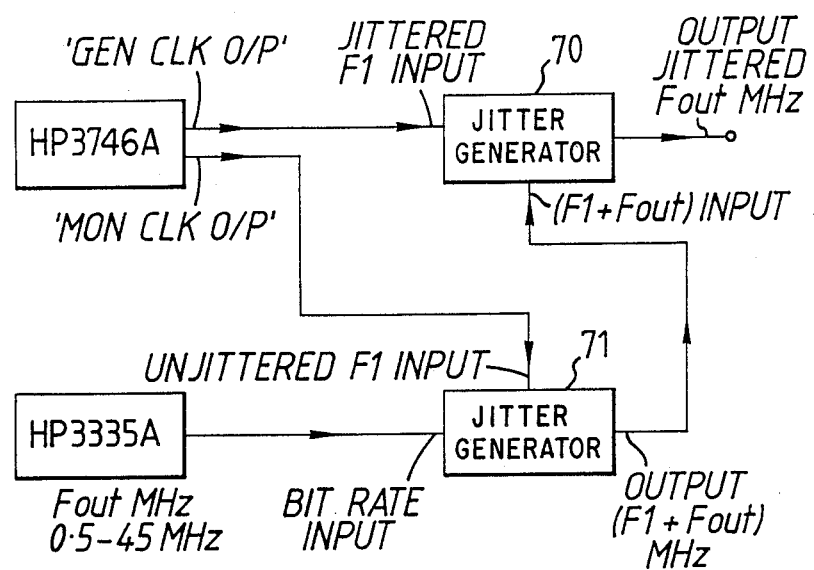
FIG. 5 is a block diagram illustrating a practical arrangement incorporating a jitter generator in accordance with the present invention.

A practical arrangement implementing the principles described particularly with reference to FIG. 2 is shown in FIGS. 3, 4, and 5. FIG. 3 shows a practical implementation of the lowpass filter 15 and the sine to squarewave converter 16. In FIG. 3 the jittered input at frequency F1 is applied to the mixer 12 via an attenuator 30, an amplifier 31, a bandpass filter 32 and an attenuator 33. In the mixer 12, the jittered input at F1 is mixed with the F1+Fout input from the first frequency translation device. The output from the mixer 12 is fed via a further attenuator 35, equaliser 36, lowpass filter 37, attenuator 38, and amplifier 39 to the sine to squarewave converter which is shown at 40 in FIG. 3. The jittered output at Fout appears at the output of the sine to squarewave converter 40.

FIG. 4 shows in more detail a practical implementation of the first frequency translation device in which the mixer 20 and bandpass filter 21 of FIG. 2 have been replaced by a phase locked loop arrangement 48. Referring to FIG. 4, the bit rate input on a line 50, which can be a sinewave or squarewave, is fed a Schmitt trigger 51. The output of the Schmitt trigger 51 is fed to a loop comprising a digital phase sensitive detector 52, a loop filter 53 a voltage controlled oscillator 54, a power splitter 55, an amplifier 56, a mixer 57, an attenuator 58, a lowpass filter 59, a differential amplifier 60 and a Schmitt trigger 61. The mixer 57 also receives on a line 63 the unjittered signal at F1 which comes from the oscillator 10 of FIG. 2. The output from the power splitter 55 is fed to an amplifier 64, the output from which is the output at F1+Fout which is fed to the mixer 12 of FIG. 3. The arrangement shown in FIG. 4 allows the system to be used to lower bit rates than would have been practical with the schematic arrangement shown in FIG. 2. The loop system is a phase lock loop system which is known per se and will not be described in detail here, since its operation will be apparent to those skilled in the art.

FIG. 5 shows how the circuit of FIG. 3 shown as block 70 and the loop arrangement of FIG. 4 shown as block 71 can be used in conjunction with an HP3746A instrument and an HP3335A instrument. The HP3746A is a jitter generator which produces a jittered output at F1 which is fed to the attenuator 30 of circuit 70 and an unjittered output at F1 which is fed to the line 63 of circuit 71. The HP3335A is a synthesiser with a sine wave output and can produce bit rate inputs at 50 over a wide range of frequencies.

I claim:

1. A circuit for varying the frequency of jitter signals used for testing apparatus using pulse code modulation to convey intelligence comprising:
   a first oscillator,
   a jitter signal generator coupled to said first oscillator,
   a variable frequency oscillator,
   a first mixer having two inputs and an output,
   means for coupling said jitter signal generator to one input of said first mixer, and
   means for coupling said variable oscillator to the other input of said first mixer.

2. A circuit as set forth in claim 1 wherein said means for coupling said variable frequency oscillator to the other input of said first mixer includes a second mixer having one input coupled to said first oscillator, another input coupled to said variable frequency oscillator and an output coupled to said other input of said first mixer.

3. A circuit as set forth in claim 2 wherein said means for coupling said variable frequency oscillator to the other input of said first mixer includes means for preventing signals from said first oscillator from appearing at said other input.

4. A circuit as set forth in claim 2 wherein a band pass filter is coupled between the output of said second mixer and said other input of said first mixer so as to pass only one of the sidebands appearing at the output of said second mixer.

5. A circuit as set forth in claim 2 further comprising a filter for passing to its output only one of the sidebands produced by said first mixer.

6. A circuit as set forth in claim 5 further comprising a sine wave to square wave converter coupled to the output of said filter.

7. A circuit as set forth in claim 1 wherein said means for coupling said variable frequency oscillator to the other input of said first mixer includes a phase locked loop having one input coupled to said first oscillator, another input coupled to said variable frequency oscillator and an output coupled to said other input of said first mixer.

8. A circuit as set forth in claim 1 further comprising:
a filter for passing to its output one of the sidebands produced by said first mixer.

9. A circuit as set forth in claim 8 further comprising a sine wave to square wave converter coupled to the output of said filter.

10. A circuit for varying the frequency of jitter signals comprising:
a first oscillator, having an output,
a jitter signal generator coupled to the output of said first oscillator,
a mixer having two inputs and an output, one of said inputs being coupled to said jitter generator,
a variable frequency oscillator having an output,
heterodyning means coupled to the output said first oscillator and to the output of said variable frequency oscillator for deriving one of the sidebands produced by the multiplication of the signals appearing at said outputs,
means for coupling said heterodyning means to the other input of said mixer, and
means coupled to the output of said mixer for selectively passing that sideband containing only the frequency of said variable oscillator.

* * * * *